United States Patent [19]
Bohnert et al.

[11] Patent Number: 5,715,058
[45] Date of Patent: Feb. 3, 1998

[54] METHOD AND DEVICE FOR THE OPTICAL DETERMINATION OF A PHYSICAL QUANTITY

[75] Inventors: Klaus Bohnert, Niederrohrdorf; Jürgen Nehring, Wettingen, both of Switzerland

[73] Assignee: ABB Research Ltd., Zurich, Switzerland

[21] Appl. No.: 781,749

[22] Filed: Jan. 10, 1997

Related U.S. Application Data

[63] Continuation of Ser. No. 420,808, Apr. 12, 1995, abandoned.

[30] Foreign Application Priority Data

May 9, 1994 [DE] Germany ............... 44 16 298.7

[51] Int. Cl.⁶ ........................................... G01J 4/00
[52] U.S. Cl. ................................. 356/365; 324/96
[58] Field of Search .......................... 356/364–370; 324/77 K, 96, 97; 364/577; 250/225

[56] References Cited

U.S. PATENT DOCUMENTS

| | | | |
|---|---|---|---|
| 3,516,727 | 6/1970 | Hickey et al. | 350/160 |
| 3,675,125 | 7/1972 | Jaecklin | 250/225 |
| 3,693,082 | 9/1972 | Jaecklin | 324/96 |
| 3,743,929 | 7/1973 | Lesueur | 324/96 |
| 4,749,854 | 6/1988 | Martins | 250/225 |
| 4,855,591 | 8/1989 | Nakamura et al. | 250/225 |
| 4,904,931 | 2/1990 | Miller | 356/365 |
| 4,970,385 | 11/1990 | Tatsuno et al. | 250/225 |
| 5,038,029 | 8/1991 | Marten et al. | 250/225 |

FOREIGN PATENT DOCUMENTS

| | | |
|---|---|---|
| 0 293 922A2 | 12/1988 | European Pat. Off. |
| 0410234 | 7/1990 | European Pat. Off. |
| 0454860 | 11/1991 | European Pat. Off. |
| 2026146 | 9/1971 | Germany |
| 2158563 | 6/1972 | Germany |
| 3607462 A1 | 9/1987 | Germany |
| 3729382 A1 | 3/1989 | Germany |
| 3742878 A1 | 7/1989 | Germany |
| 3829103 A1 | 3/1990 | Germany |
| 3924369 A1 | 1/1991 | Germany |
| 3927885 A1 | 2/1991 | Germany |
| 4205509 A1 | 8/1993 | Germany |
| 0137768 | 8/1983 | Japan |
| 2 167 554 | 5/1986 | United Kingdom |
| WO92/21949 | 12/1992 | WIPO |

*Primary Examiner*—Hoa Q. Pham
*Attorney, Agent, or Firm*—Burns, Doane, Swecker & Mathis

[57] ABSTRACT

In order to detect, in particular, a high electric voltage (8), use is made of an electrooptic sensor with an electrooptic crystal (4) such as is applied in Pockels cells. Light is irradiated into the electrooptic crystal (4) in a linearly polarized fashion from a light source (L) via a fiber coupler (FK), a fiber-optic cable (F1), a collimator (K1), a 1st polarizer (P1), a beam splitter (1), and 1st and 2nd glass plates (2, 3). Located at the end face of said crystal is a 3rd glass plate (5) having a layer electrode (6) which simultaneously acts as a mirror (7) and retroreflects the incident light through the electrooptic crystal (4). One component beam (T1) of the reflected light passes back to a 1st light detector (D1) via the beam splitter (1) and the 1st polarizer (P1), now acting as an analyzer. A 2nd component beam (T2) passes to a 2nd light detector (D2) via a λ/4-delay plate (9), a 2nd polarizer (P2), a 90° prism (10), a collimator (K2) and a 2nd fiber-optic cable (F2). Light intensities ($I_1$) and ($I_2$) are evaluated by means of a microprocessor (14). Owing to the fact that the two phase-shifted light signals are derived from a common optical channel, an intrinsic birefringence of the electrooptic crystal (4) does not affect their phase difference. A 9° prism can be used instead of a mirror (7) for reversing the light. Input and output channels of the light can be separate. Ways are specified for the temperature compensation of a measurement result signal (S).

11 Claims, 9 Drawing Sheets

METHOD AND DEVICE FOR THE OPTICAL DETERMINATION OF A PHYSICAL QUANTITY

This application is a continuation of application Ser. No. 08/420,808, filed Apr. 12, 1995 now abandoned.

BACKGROUND OF THE INVENTION

1. Field of the Invention

The invention proceeds from a method and a device for the optical determination of a physical quantity.

2. Discussion of Background

The present invention generally relates to prior art such as is disclosed in U.S. Pat. No. 4,904,931. There, 2 mutually parallel light beams are sent through a 1st polarizer, thereafter through an electrooptic crystal, through one $\lambda/8$-plate and 45° delay plate in each case with +45° or −45° phase shift, and thereafter through a 2nd polarizer common to both light beams. The output signals are detected separately by means of photodiodes, converted into electric signals and evaluated. A crystal of potassium hydrogen phosphate such as is used in Pockels cells is used as the electrooptic crystal. This crystal has a 4-fold rotation of symmetry parallel to the direction of the light propagation; in a plane perpendicular to this main direction, it has 2 principal electrooptic axes which are oriented orthogonally relative to one another and along which light propagates at different speeds when an electric voltage is applied to the crystal parallel to the direction of the light propagation. The difference between the different rates of propagation is proportional to the electric voltage, with the result that the electric voltage can be determined from the difference in the propagation time. The two light-emitting photodiodes used as light sources are controlled to a constant and equal peak value as a function of the two output signals, phase-shifted by 90°, of the receiving diodes. In the case of high voltages, the voltage-induced phase shift of the light in the electrooptic crystal can traverse a plurality of periods, with the result that when evaluating the measured light intensity I of only one light beam the relationship between the output signal and the voltage to be measured would be ambiguous. It holds for I that:

$$I = I_0 \cdot (1 + \sin\Gamma)/2, \quad (1)$$

it being the case that $I_0$ signifies, neglecting losses in the crystal, in the polarizers etc., the light intensity occurring at the 1st polarizer, and $\Gamma$ signifies the optical phase shift generated by the induced birefringence, which is proportional to the applied electric field. For a sinusoidal alternating voltage, $\Gamma(t) = \Gamma_0 \cdot \sin(\omega \cdot t)$ where $\omega$=angular frequency and $t$=time. It is not possible, inter alia, without further measures uniquely to determine the direction of the voltage, increasing or decreasing, when the voltage peaks coincide in time with an extreme value of the function $\sin\Gamma(t)$. This problem is solved in U.S. Pat. No. 4,904,931 by equipping the sensor with a 2nd optical channel. A phase difference of 90° is set between the two channels with the aid of 2 45° delay plates.

Channel 1: $I_1(t) = I_0 \cdot (1 + \sin(\Gamma(t) - 45°))/2$,

Channel 2: $I_2(t) = I_0 \cdot (1 + \sin(\Gamma(t) + 45°))/2$. (2)

These signals, phase-shifted by 90°, can be processed by means of an appropriate electronic evaluating system in such a way that a temporal image of the AC voltage applied to the crystal is produced again as output signal.

The additional 2nd channel has the effect of doubling the number of most of the optical components: light source, fiber-optic cable, collimators, polarizers - and this substantially increases the sensor costs. The frequently non-negligible birefringence of the crystal as a consequence of frozen mechanical stresses and defects is normally different for the two channels. As a consequence thereof, the actual phase difference between the two channels deviates from 90° and is, moreover, dependent on temperature. The optical system for the two channels has a comparatively large space requirement and renders a correspondingly large crystal cross section necessary. However, a large crystal cross section has an unfavorable effect on the electric strength of the overall arrangement and increases the crystal costs.

SUMMARY OF THE INVENTION

Accordingly, one object of the invention is to provide a method and a device for the optical determination of a physical quantity of the type mentioned at the beginning in such a way that the two phase-shifted signals for forming the physical quantity can be derived from a common optical channel.

One advantage of the invention is that the intrinsic birefringence of the crystal no longer has any influence on the phase difference between the two signals. Furthermore, fewer optical components are required. All that remains necessary is an optical light source. Because of the smaller space requirement, the crystal cross section can be substantially reduced.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
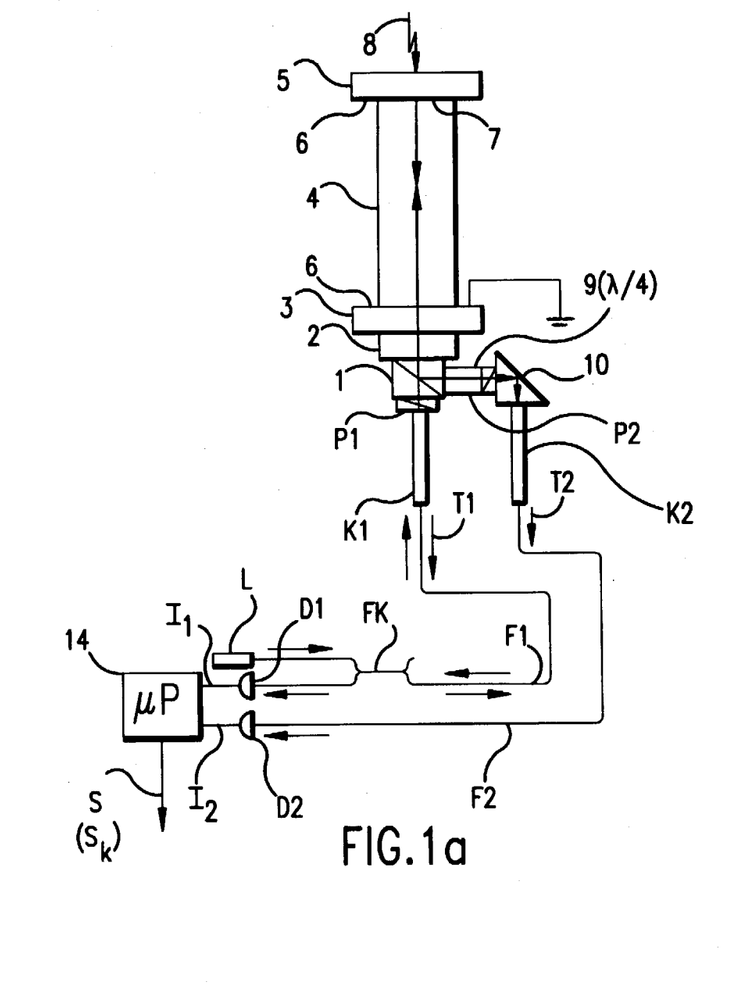
FIGS. 1a and 1b show sensor configurations with a combined transmitting and receiving path.
Figure 1B:
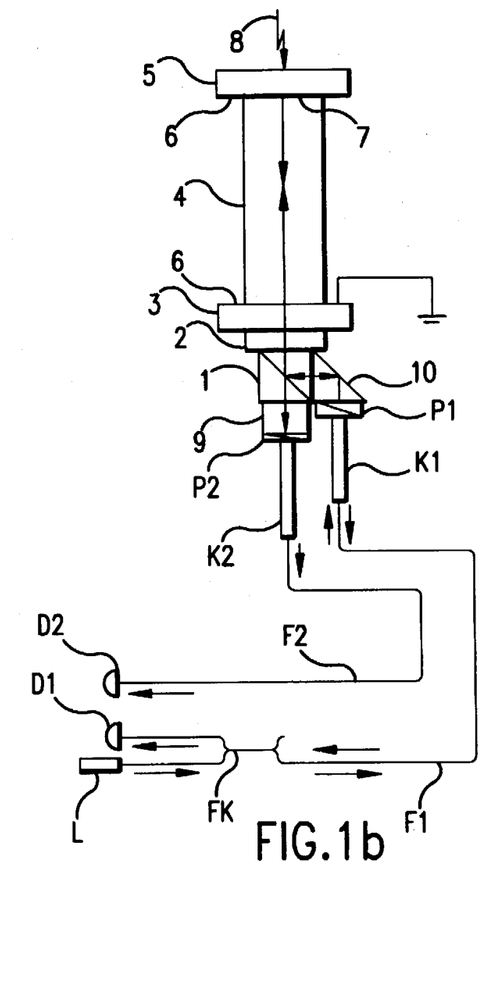

Referring now to the drawings, wherein like reference numerals designate identical or corresponding parts throughout the several views, in FIGS. 1a and 1b 2 variants of a sensor set-up with combined transmitting and receiving paths are shown. In the sensor set-up in accordance with FIG. 1a, the light emitted from a light source (L), for example a laser diode, firstly traverses a fiber-optic beam splitter or fiber coupler (FK) and then a fiber cable, preferably a fiber-optic cable (F1), through which it is transmitted to the sensor head. The light is collimated there by a 1st collimator (K1) and thereafter linearly polarized by a downstream 1st polarizer (P1). It then traverses sequentially a beam splitter (1), 1st and 2nd glass plates (2, 3) and an electrooptic crystal (4) which is sealed at the end by an electrically conductive, optically reflecting, aluminized 3rd glass plate (5). (6) denotes layer electrodes, the layer electrode on the 2nd glass plate (3) being an electrically grounded transparent indium tin oxide layer. (7) denotes a mirror. In the case of the 3rd glass plate (5), the layer electrode (6) serves simultaneously as a mirror (7); it includes a gilded chromium layer which surrounds the 3rd glass plate (5). The light beam is retroreflected into itself at the 3rd glass plate (5), with the result that it once again traverses the electrooptic crystal (4). It is decomposed in the beam splitter (1) into 2 component beams (T1, T2). A 1st transmitted component beam (T1) runs via the 1st polarizer (P1), which now acts as an analyzer, through the 1st collimator (K1) and the fiber-optic cable (F1) to the fiber coupler (FK). From there, a fraction of the light determined by the coupling ratio passes to an optoelectric detector or to a 1st light detector (D1), which on the output side supplies an electric signal ($I_1$), proportional to the received light intensity, to an electronic evaluating system or a computer or microprocessor (14) at which a measurement result signal (S) can be tapped at the output side.

A 2nd component beam (T2) reflected at the beam splitter (1) firstly traverses a phase-delay plate, preferably a $\lambda/4$-delay plate (9), thereafter a 2nd polarizer (P2), a deflecting prism or 90° prism (10) and a 2nd collimator (K2) which launches the component beam (T2) into a 2nd fiber-optic cable (F2). Through this fiber-optic cable (F2), the component beam (T2) finally passes to a 2nd light detector (D2) which supplies on the output side an electric signal ($I_2$), proportional to the received light intensity, to the microprocessor (14).

The 3 glass plates (2, 3, 5) are not essential to the principle of the mode of operation of the sensor. In practice, they serve as holding elements and substrates for the vapor-deposited layer electrodes (6), to which an electric voltage or high voltage (8) which is to be detected is applied. The 1st glass plate (2) serves only as an intermediate element. In order to keep thermally induced stresses as small as possible, the glass of the 3 glass plates (2, 3, 5) should have a similar thermal expansion coefficient as the electrooptic crystal (4).

In FIG. 1b, input and output channels are interchanged by contrast with FIG. 1a.

Figure 2A:
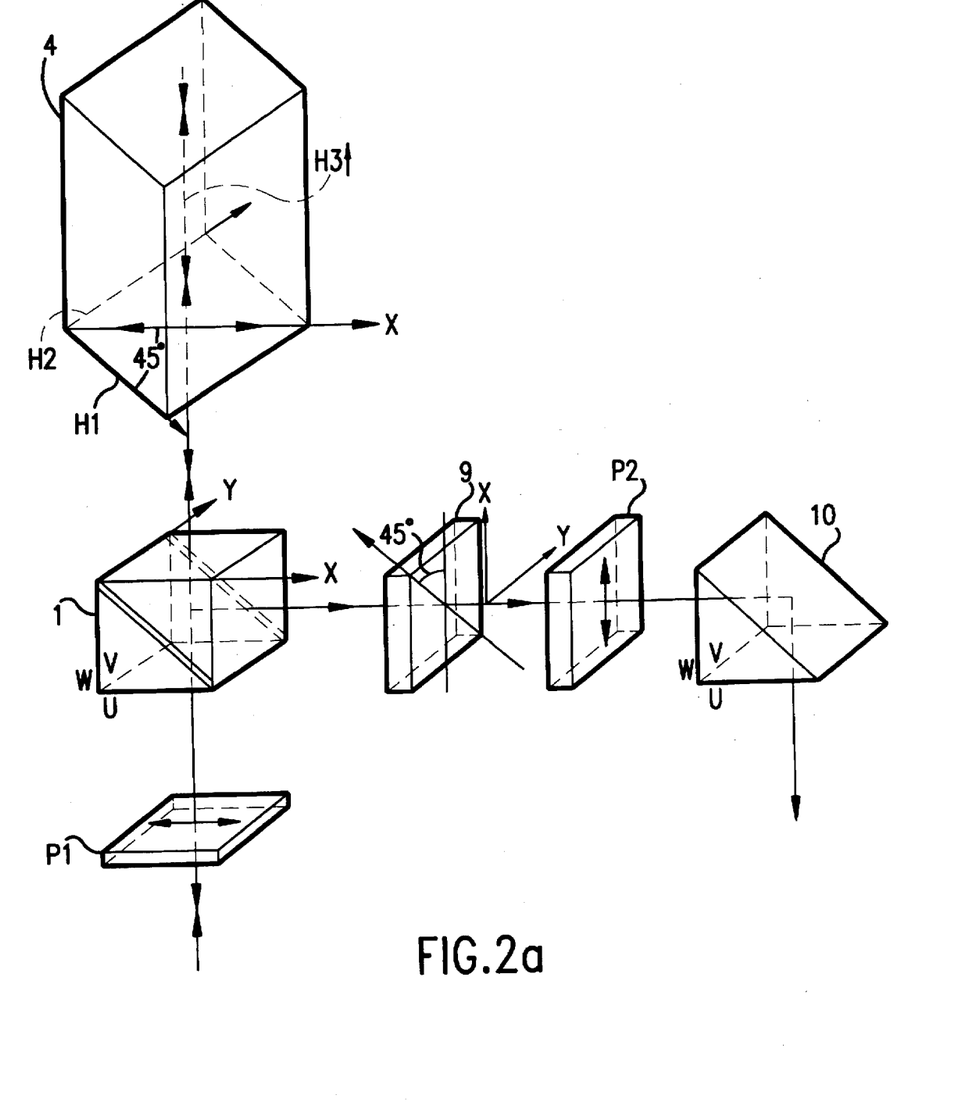
FIGS. 2a and 2b show angular orientations of components of the sensor configurations in accordance with FIGS. 1a and 1b, respectively.

FIG. 2a specifies the angular orientation of the optical components for the sensor configuration in accordance with FIG. 1a. The polarization direction of the 1st polarizer (P1) is parallel to one of the two mutually orthogonal edges (u, v) of the base surface of the beam splitter (1), whose 3rd edge (w) is orthogonal to the other two edges. The polarization is therefore parallel or perpendicular to the optical plane of incidence which is relevant to the beam splitting (p-polarization or s-polarization in the polarization directions (x) and (y), respectively, that is to say polarizations parallel and perpendicular to the respective optical plane of incidence). This linear polarization is then maintained during transmission through the beam splitter (1). Another orientation of the 1st polarizer (P1) would entail that there would be a transition of the light into an elliptical polarization state, since s-fractions and p-fractions generally experience different phase shifts upon transmission through the beam splitter (1). 2 electrooptically distinctive 1st and 2nd axes (H1, H2) of the electrooptic crystal (4) are perpendicular to the beam direction and also perpendicular to a 3rd distinctive optical axis (H3) of the electrooptic crystal (4) in the beam direction. The 1st and 2nd electrooptically distinctive axes (H1, H2) form a 45° angle with the polarization direction of the incident light. The end faces of the electrooptic crystal (4) are likewise perpendicular to the beam direction. The principal axis of the $\lambda/4$-delay plate (9) is perpendicular to the direction of the light beam reflected at the beam splitter (1), and forms an angle of +45° or −45° with the directions of the edges (v, w) of the beam splitter (1); it is thus simultaneously parallel to the projection of one of the electrooptic axes of the electrooptic crystal (4). The polarization direction of the 2nd polarizer (P2) is at 45° to the main axis of the $\lambda/4$-delay plate (9). The edges (u, v, w) of the 90° prism (10) are parallel to the corresponding edges (u, v, w) of the beam splitter (1).

Figure 2B:
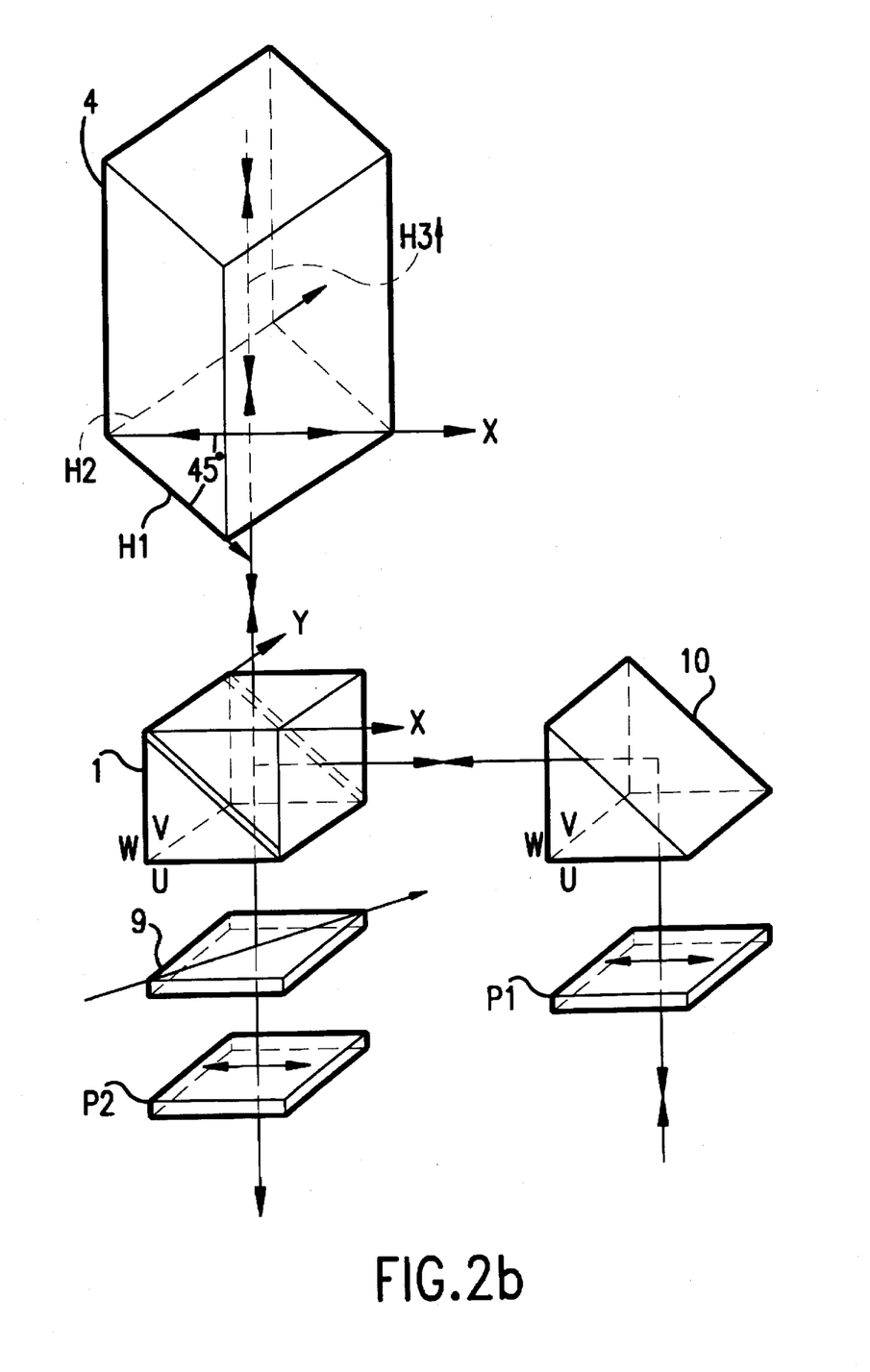

FIG. 2b shows the orientation of the light components for the sensor set-up in accordance with FIG. 1b.

Amplitude Effects and Phase Effects

Effects are considered below which have a disturbing effect on the relative phase $\Gamma$ and a modulation contrast $K_1$ and $K_2$, respectively, of the electrooptic signals $I_1$, $I_2$. The conclusions which result therefrom for the selection, arrangement and angular orientation of the components are explained.

The most important disturbing effects are:

The beam splitter (1) introduces different phase shifts for p-polarizations and s-polarizations, both in reflection and in transmission.

Reflectivity and transmission are generally different for s-polarizations and p-polarizations.

The 90° prism (10) likewise introduces a phase difference between s-polarizations and p-polarizations.

Added further to this there may be disturbing effects caused by an inaccurate $\lambda/4$-delay plate (9) and/or an inaccurate angular adjustment of the components.

The signals $I_1$ and $I_2$ in the two channels can be represented as:

$$I_1(t) = I_0 \cdot [A_1 + B_1 \cdot \cos(\Gamma - \epsilon_1)]/2 \text{ and} \qquad (3)$$

$$I_2(t) = I_0 \cdot [A_2 + B_2 \cdot \cos(\Gamma + \pi/2 - \epsilon_2)]/2, \qquad (4)$$

it being the case that equation (3) holds for the channel without, and equation (4) holds for the channel with the $\lambda/4$-delay plate (9). In this case, $A_1$, $B_1$ and $A_2$, $B_2$ respectively designate coefficients for determining the modulation contrast $K_1$ and $K_2$, respectively, where $K_1 = B_1 A_1$ and $K_2 = B_2 A_2$, $\Gamma$ denotes the electrooptic phase shift, and $\epsilon_1$ and $\epsilon_2$ denote additional phase terms which lead to a deviation from the 90° phase shift.

It holds in the ideal case that: $A_1 = B_1 = A_2 = B_2 = 1$ and $\epsilon_1 = \epsilon_2 = 0$.

1st Effect of the Beam Splitter

In the channel without the $\lambda/4$-delay plate (9), the above-named disturbing effects have no effect on the contrast and the 90° phase shift, if the orientations shown in FIGS. 2a and 2b are selected, that is to say it then holds that $A_1=B_1=1$ and $\epsilon_1=0$, and consequently: $I_1=I_0\cdot[1+\cos\Gamma]/2$.

It holds for the channel with the λ/4-delay plate (9) and the special case $\delta_1\neq 0$, $a_s=a_p$ that:

$A_2=1$, $B_2=\cos\delta_1$, $\epsilon_2=0$, and thus that $$I_2=I_0\cdot[1+\cos\delta_1\ \cos(\Gamma+\pi/2)]/2, \quad (5)$$

it being the case that $a_s$ and $a_p$ signify the amplitudes of luminous intensity for s-polarization and p-polarization after reflection at the beam splitter (1) or after the 2nd transmission through the beam splitter (1), and $\delta_1$ signifies the phase shift, introduced by the beam splitter (1), between s-polarization and p-polarization, which is normally different for reflection and transmission.

The modulation contrast $K_2$ is reduced by a factor of $\cos\delta_1$. The 90° phase shift remains unaffected ($\epsilon_2=0$).

The result for the channel with the λ/4-delay plate (9) and the general case $\delta_1\neq 0$, $a_s\neq a_p$ is:

$$A_2=(a_s^2+a_p^2)/2, \quad (6)$$

$$B_2=[a_s^2\cdot a_p^2\cdot\cos^2\delta_1+(a_s^2-a_p^2)^2/4]^{0.5}\text{ and} \quad (7)$$

$$\epsilon_2=\arctan(a_s^2-a_p^2)/(\pm 2\cdot a_s\cdot a_p\cdot\cos\delta_1). \quad (8)$$

The ±-sign relates to the orientation of the λ/4-delay plate (9), that is to say to the quick axis under ±45° with respect to the polarization direction (x). In this case, both the modulation contrast $K_2$ and the 90° phase shift are affected in principle by the beam splitter (1).

Figure 3:
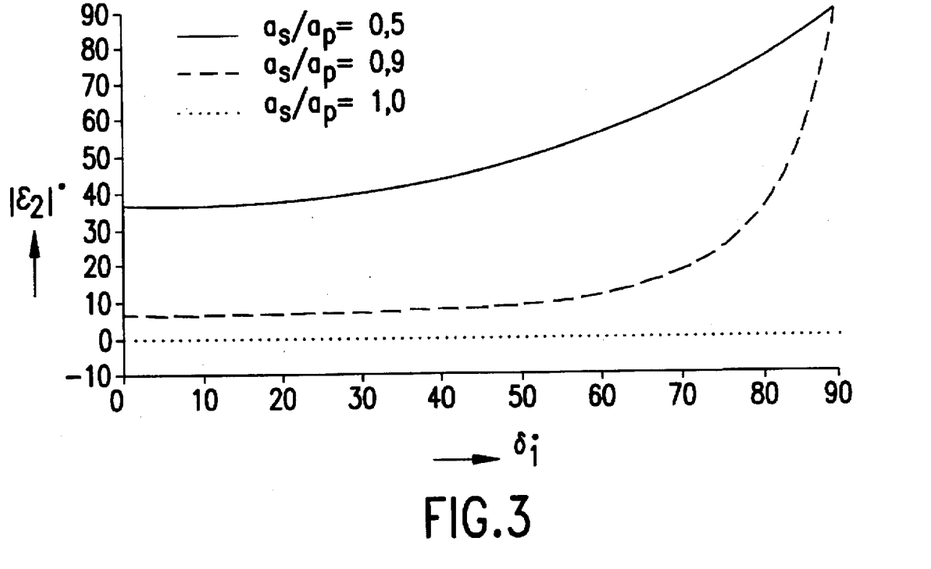
FIG. 3 shows error curves of a 90° phase shift as a function of the relative phase delay between an s-polarization and a p-polarization on a beam splitter of the sensor configurations in accordance with FIGS. 1a and 1b.

FIG. 3 shows the absolute value $|\epsilon_2|$ of the error of the 90° phase shift as a function of the relative phase delay $\delta_1$ of the beam splitter (1) for amplitude ratios $a_s/a_p=0.5$ or 0.9 or 1.0. It is seen that the relative phase delay $\delta_1$ has no effect on the 90° phase shift ($\epsilon_{20}$) if the amplitudes $a_s$, $a_p$ for the s-polarization and p-polarization are equal (line of short dashes). By contrast, an error is always present for unequal amplitudes, compare the line of long dashes and the continuous line.

Figure 4:
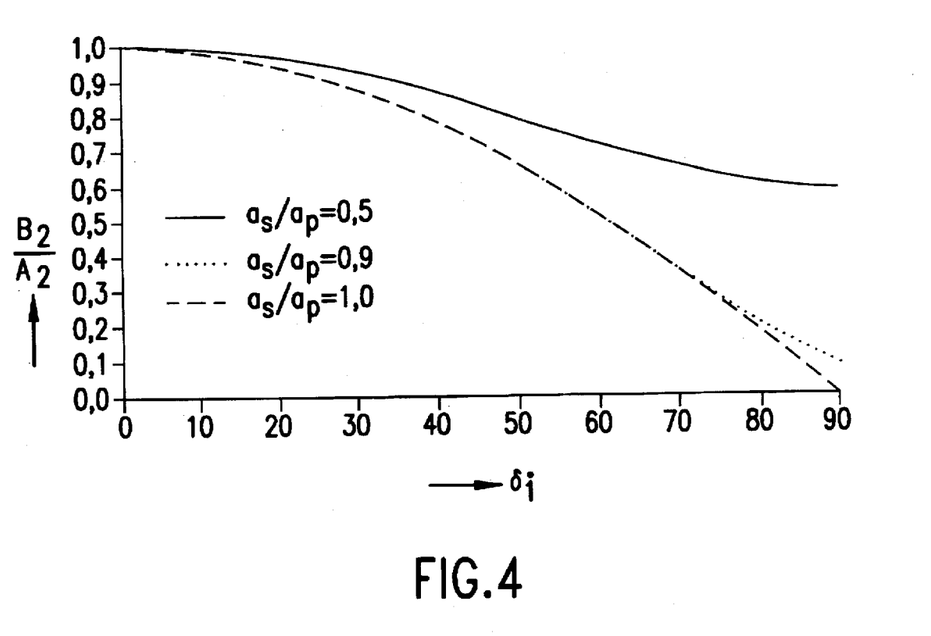
FIG. 4 shows the contrast of the electrooptic modulation in the channel with a $\lambda/4$-plate as a function of the relative phase delay between an s-polarization and a p-polarization on a beam splitter.

FIG. 4 shows the modulation contrast $K_2=B_2/A_2$ as a function of the relative phase delay $\delta_1$ for the 3 amplitude ratios $a_s/a_p=0.5$ or 0.9 or 1.0 specified in connection with FIG. 3. The modulation contrast $K_2$ is impaired only insubstantially almost independently of the amplitude ratio $a_s/a_p$ for relative phase delay $\delta_1$ at the beam splitter (1) of less than 10°.

The following values were measured for a commercially available cuboid beam splitter (1) with a metal/dielectric hybrid splitter layer:
Transmission: $\delta_1=1°$, $a_s/a_p=0.954$,
Reflection: $\delta_1=6°$, $a_s/a_p=1.049$.

The spread of the values for different specimens of this splitter type was slight.

Consequently, the modulation contrast $K_2$ in the channel with the λ/4-delay plate (9) is reduced by the factors 0.986 (given the λ/4-delay plate (9) in the transmission path) or by 0.981 (given the λ/4-delay plate (9) in the reflection branch). The 90° phase shift is disturbed by the angles $\epsilon_2=2.70°$ and $\epsilon_2=2.71°$, respectively. The disturbing effects are therefore negligibly small.

For beam splitters (1) with an exclusively dielectric splitter layer, the amplitude ratio $a_s/a_p$ differs extremely strongly from 1 and has a correspondingly large effect on the modulation contrast $K_2$ and the 90° phase shift, see FIGS. 3 and 4.

It is preferable to select a type of beam splitter for which the amplitude ratio $a_s/a_p$ lies as close as possible to 1 and the phase delay $\delta_1$ lies as close as possible to 0. If the relative phase delay $\delta_1$ differs strongly for transmission and reflection, the channel with the λ/4-delay plate (9) is preferably placed into the branch with the smaller value of the relative phase delay $\lambda_1$.

2. Additional effect of phase error of the λ/4-delay plate (9):

It can occur in practice that in addition to the disturbing effects just mentioned, owing to the λ/4-delay plate (9) the phase delay deviates from the 90° phase shift by a phase displacement angle $\delta_3$. It then holds for the coefficients $A_2$, $B_2$ and the 90° error $\epsilon_2$ for the case in which the 1st polarizer (P2) (analyzer) is aligned parallel to the polarization direction (y) (s-polarization in accordance with FIGS. 2a and 2b) that:

$$A_2=(a_s^2+a_p^2)/2-(a_s^2-a_p^2)\cdot\sin\delta_3/2, \quad (9)$$

$$B_2=\{a_s^2\cdot a_p^2\cdot\cos^2\delta_1\cdot\cos^2\delta_3+[(a_s^2-a_p^2)-(a_s^2+a_p^2)\cdot\sin\delta_3]^2/4\}^{0.5}\text{ and} \quad (10)$$

$$\epsilon_2=\arctan[(a_s^2-a_p^2)-(a_s^2+a_p^2)\cdot\sin\delta_3]/(\pm 2\cdot a_s\cdot a_p\cdot\cos\delta_1\cdot\cos\delta_3). \quad (11)$$

If the 1st polarizer (P2) is parallel to the polarization direction (x), the signs of $B_2$ and $\epsilon_2$ change in equation (4), that is to say it holds that $$I_2(t)=I_0\cdot[A_2-B_2\cdot\cos(\Gamma+\pi/2+\epsilon_2)]/2. \quad (12)$$

Consequently, the 2nd sign changes in equation (9), the 3rd sign in equation (10), and the 2nd sign in equation (11).

Where $\delta_1=1°$ and $a_s/a_p=0.954$, the result for a phase displacement angle $\delta_3=1.8°$ is a deviation from the 90° phase shift by $\epsilon_2=0.90°$ for the 2nd polarizer (P2) ∥ x or
$\epsilon_2=4.49°$ for the 2nd polarizer (P2) ∥ y, respectively.

It may be seen that given these relatively small disturbing effects, the phase displacement angle $\delta_3$ of the λ/4-delay plate (9) is either added to or subtracted from the 90° error of 2.7° calculated above for $\delta_3=0°$, depending on the polarization position. The 90° error can thus be compensated to 0 by a specific selection of $\delta_3$.

A rotation of the 1st polarizer (P1) from x to y or from y to x has no effect on the 90° phase shift or the modulation contrast.

Disturbing effects which are produced by an inaccurate azimuthal orientation of the components are not considered here. In practice, the angular adjustment can be undertaken so accurately that these disturbing effects play no role.

3. Effect of the 90° prism (10):

In the case of total reflection, a phase shift of 36.9° for a refractive index of the prism of 1.5 is produced in the 90° prism (10) between s-polarization and p-polarization.

If the 90° prism (10) in accordance with FIG. 1b is located in the receiving channel without the λ/4-delay plate (9), this phase shift has no effect on the sensor signals for the angular orientations specified in FIG. 2b. If the 90° prism (10) in accordance with FIGS. 1a and 2a is located in the beam path with the λ/4-delay plate (9), the λ/4-delay plate (9) and the 2nd polarizer (P2) must be located upstream of the 90° prism (10), that is to say between the 90° prism (10) and beam splitter (1). An arrangement between the 90° prism (10) and the collimator (K2) would entail the modulation contrast in this channel reducing by a factor of approximately 0.8.

Figure 5:
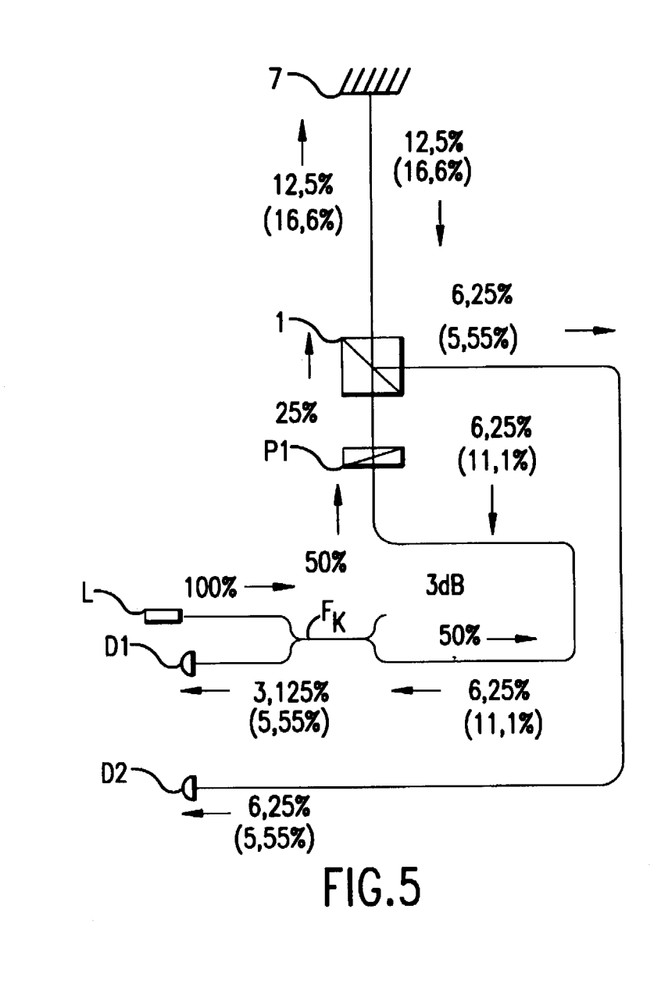
FIG. 5 shows relative light powers for the sensor configurations in accordance with FIGS. 1a and 1b, FIGS. 6a and 6b show sensor configurations with separate transmitting and receiving paths.

FIG. 5 shows the relative optical power balance for the ideal, lossless case and a splitter ratio of 1:1 both at the fiber coupler (FK) and at the beam splitter (1). The light power launched at the light source (L) into the fiber-optic cable (F1) is assumed to be 100%. 50% thereof is left over downstream of the fiber coupler (FK). Since the light arrives unpolarized at the 1st polarizer (P1), the light power is halved a further time by the 1st polarizer (P1) to 25% of the original light power. After the 2-fold traversal of the beam splitter (1), the light intensities are reduced to 6.25%. This is the maximum light power, corresponding to the maxima of the electrooptic modulation given by $I_1(t)$ and $I_2(t)$, which passes into the receiving channels through the analyzers (P1, P2). In one channel, this light power is halved a further time by the fiber coupler (FK), with the result that, finally, at the maximum of the modulation 3.125% or 6.25% of the original light power is still incident at the light detectors (D1, D2).

If a beam splitter (1) with a ratio of transmission to reflection of 2:1 is used both for s-polarization and for p-polarization, the result is that the maximum light powers incident at the two light detectors (D1, D2) are equal. They then amount respectively to 5.55% of the original power, compare the values specified in brackets.

Figure 6A:
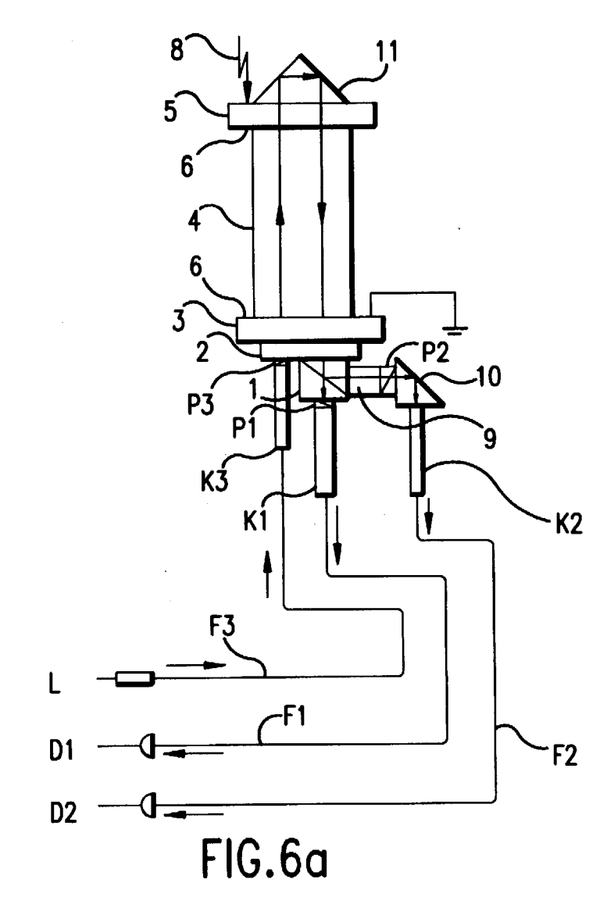
Figure 6B:
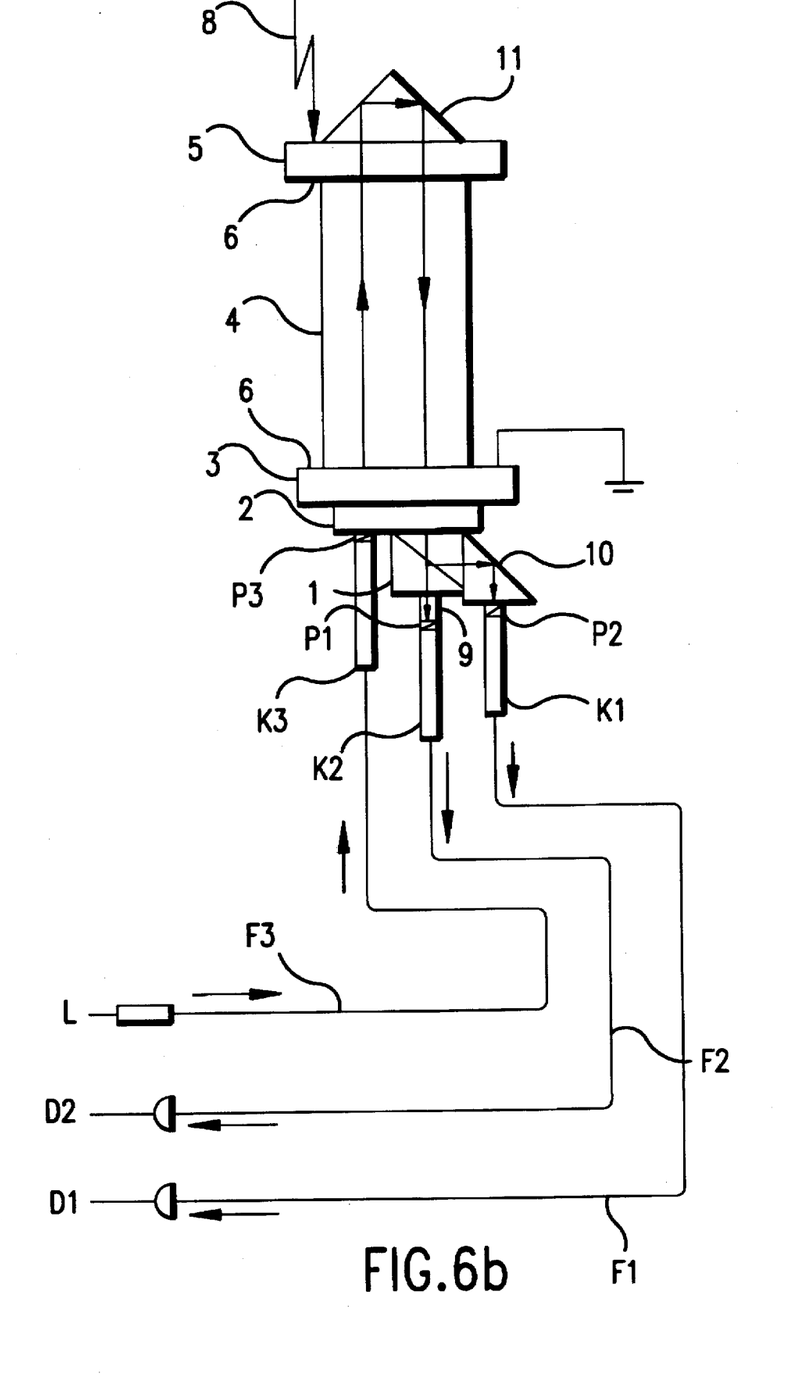

FIGS. 6a and 6b show 2 further sensor variants, in which the transmitting and receiving paths are separate. Here, as well, each of the sensors requires only one light source (L). The two 90° phase shifts are, in turn, derived from a common optical beam path in the electrooptic crystal (4), with the result that the birefringence of the electrooptic crystal (4) does not affect the 90° phase shift. The optical system for generating the 90° phase shift is the same as in the case of FIGS. 1 and 2. Like the 3rd glass plate (5), the 2nd glass plate (3) has here a layer electrode (6) transparent to optical signals. The deflection of the input light beam is performed not by a mirror (7), but by a 90° prism (11) on the 3rd glass plate (5).

Advantages of these two sensor variants are:

In the sensor variants in accordance with FIGS. 1a and 1b, it is possible chiefly at the 1st light detector (D1) for a signal background to occur as a consequence of undesired reflections from the optical system. The reason for such reflections is steps in refractive index at the interfaces, in particular in fiber plugs. In the case of the sensor configurations in accordance with FIGS. 6a and 6b, such reflections do not pass to the detectors, or do so only in a very attenuated form, and are therefore not particularly disturbing. The quality of the fiber plugs can be lower.

The fiber coupler (FK) is eliminated.

The light power at the light detectors (D1, D2) is higher.

The following disadvantages oppose the advantages:

An additional fiber-optic connection is required between the transceiver side and the sensor head.

A 3rd collimator (K3) and a 3rd polarizer (P3) are required.

The transverse dimensions of the optical system are larger. The necessary minimum cross section of the electrooptic crystal (4) is therefore likewise larger.

The same holds with reference to amplitude effects and phase effects as in the case of the sensor configurations in accordance with FIGS. 1a and 1b. In addition, the relative phase shifts in the case of the 2-fold reflection in the 90° prism (11) at the upper surface of the 3rd glass plate (5) by an angle $\phi_2$ between the s-polarization and p-polarization in each case are to be considered, the value being $\phi_2=36.9°$ for a refractive index of 1.5 for the 90° prism (11). In order for these phase shifts not to have an effect on the relative phase of the 90° phase shift or the modulation contrast, the edges of the base surface of the prism should be aligned parallel to the electrooptically distinctive axes (H1, H2) of the electrooptic crystal (4). The two signals of the 90° phase shifts are then displaced jointly by the same phase angles $2\cdot\phi_2$, their relative phase remaining unchanged, however. The signals for the light intensity $I_1$ and $I_2$ are then given, by modifying equations (3) and (4), by:

$$I_1(t)=I_0\cdot[A_1+B_1\cdot\cos\ (\Gamma-\epsilon_1)-2\phi_2]/2 \text{ and} \qquad (13)$$

$$I_2(t)=I_0\cdot[A_2+B_2\cdot\cos\ (\Gamma+\pi/2-\epsilon_2)-2\phi_2]/2, \qquad (14)$$

it being the case that equation (13) holds for the channel without, and equation (14) for the channel with the $\lambda/4$-delay plate (9).

As is set forth in more detail in the above-named U.S. Pat. No. 4,904,931, the optical phase shift $\Gamma$ proportional to the acting field or to the high voltage (8) can be determined from these two equations (13, 14). The voltage amplitude or the measurement result signal (S) being sought is then determined by calibration as a function of the optical phase shift $\Gamma$.

The sensor response is not impaired by the zero-point shift. If it is desired, it can be compensated for again in the two channels by means respectively of an additional delay plate with a delay of $2\cdot 1\Phi_2$.

If the 90° prism (11) were to be aligned with the edges at 45° to the electrooptically distinctive axes (H1, H2) of the electrooptic crystal (4), the relative phase delays of the 90° prism (11) would entail additional disturbing effects.

Figure 7:
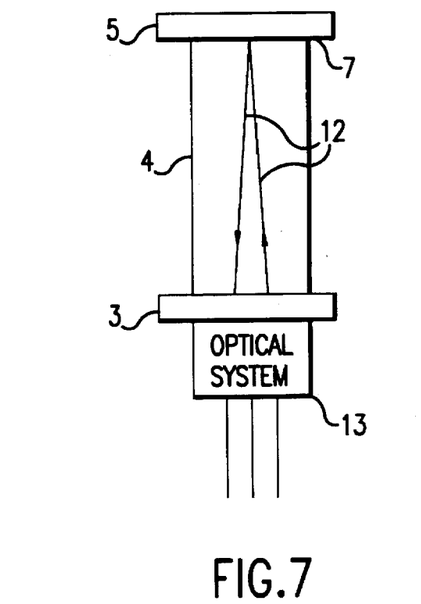
FIG. 7 shows a beam path in an electrooptic crystal in the case of the use of a mirror instead of a prism in the sensor configurations in accordance with FIGS. 6a and 6b.

In order to avoid the additional 90° prism (11), it would be possible to make the input light beam extend slightly obliquely relative to the 3rd electrooptically distinctive axis (H3) of the electrooptic crystal (4) and then to cause it to be reflected again at a mirror surface (7) of the 3rd glass plate (5), in accordance with the beam paths (12) illustrated in FIG. 7. (13) denotes an optical system composed of beam splitter (1), $\lambda/4$-delay plate (9), polarizers (P1, P2, P3), collimators (K1, K2, K3) and 90° prism (10).

Figure 8:
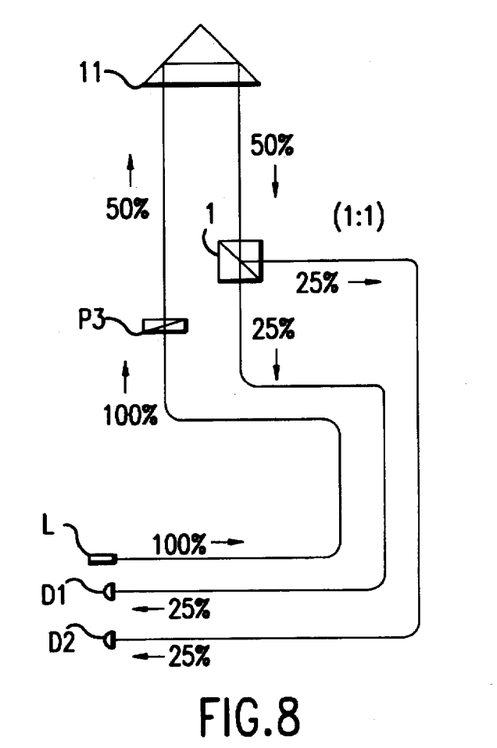
FIG. 8 shows relative light powers for the sensor configurations in accordance with FIGS. 6a and 6b for a splitter ratio of a beam splitter of 1:1.

The optical power balance is the same for both sensor configurations, and is represented in FIG. 8 for the ideal, lossless case. 25% of the original optical power arises respectively at the two light detectors (D1, D2) at the maxima of the optoelectric modulation.

The light source (L) should preferably have a short coherence length, so that, for example, no interference effects occur in the event of multiple reflections within the sensor optical system. Owing to increased noise, these could have a disturbing effect on the measured light intensities $I_1$ and $I_2$. It is preferable to use a light-emitting semiconductor diode (LED) or a multimode laser diode.

The fiber-optic connections are multimode fiber cables (F1, F2). When a laser diode is used as the light source (L), the fiber-optic cable (F1) for the transmitting path is to be selected to be at least so long (normally a few 10 m) that the light arriving at the sensor head is adequately depolarized and satisfactorily incoherent, in order to suppress signal fluctuations and noise as a consequence of polarization fluctuations and interference effects. In the case of separate transmitting and receiving paths in accordance with FIGS. 6a and 6b, a monomode fiber (F3) maintaining polarization is also suitable for the transmitting path when a multimode laser diode is selected as the light source (L). With a light-emitting semiconductor diode, the optical power launched into the monomode fiber would be too low. The fiber axes must then be aligned at the sensor head in such a way that the polarization direction lies parallel to the transmission direction of the input polarizer (P3).

In the case of combined transmitting and receiving paths in accordance with FIGS 1a and 1b, it is rather the case that a monomode fiber is unsuitable, since for relaunching the light into the fiber the requirements placed on the mechanical stability of the sensor set-up would be rendered drastically more stringent because of the small diameter of the fiber core.

Crystal classes and crystal orientations which are suitable for a line integration of the electric field and which are not birefringent without an applied electric voltage are specified in the following Table 1.

TABLE 1

| Class | Crystal axis parallel to the light propagation (H3) | Directions of the principal electrooptic axes | Materials |
|---|---|---|---|
| $\bar{4}3$ m ($T_d$) | 4-fold axis [001] | [110] and [1̄10] | $Bi_4(SiO_4)_3$ (BSO) $Bi_4(GeO_4)_3$ (BGO) ZnS, ZnSe, CuCl |
| $\bar{4}2$ m ($D_{2d}$) | 4-fold axis [001] | [110] and [1̄10] | Potassium dihydrogen phosphate $KH_2PO_4$ (KDP) |
| 23 (T) | 2-fold axis [001] | [110] and [1̄10] | Sodium chlorate $NaClO_3$ |

Here, the crystal classes are denoted by their international and, in brackets, also by their Shoenflies notation.

The two crystal classes specified in Table 2 are already birefringent without an electric field. The principal axes of the intrinsic birefringence coincide with the principal electrooptic axes, with the result that the intrinsic birefringence is added to the field-induced birefringence simply as a constant, unchanging system deviation.

TABLE 2

| Class | Crystal axis parallel to the light propagation (H3) | Directions of the principal electrooptic axes | Materials |
|---|---|---|---|
| $\bar{6}$ m2 ($D_{3h}$) | 2-fold axis | ∥ and ⊥ 3-fold axis | $LiNaCO_3$ |
| 2 mm ($C_{2v}$) | 2-fold axis [001] | [100] and [010] | $MgBaF_4$ |

There are in addition other crystal classes, which would basically also be suitable for integration, but in which the axes of the intrinsic and of the field-induced birefringence have different directions. These crystal classes will therefore not be considered in more detail.

It is important that light enters the electrooptic crystal (4) with a polarization which differs from 0° and 90°, such as between 30°–60° preferably in the range of 40°–50°, in particular below 45° relative to an electrooptically distinctive axis (H1). After a 2-fold traversal of the electrooptic crystal (4) (there and back), the light is decomposed at the beam splitter (1) into 2 component beams (T1, T2). Located in the 1st component beam (T1) is the 1st polarizer (P1) which acts as an analyzer for this channel. The 2nd component beam (T2) runs via the λ/4-delay plate (9), which produces the 90° phase shift between the two channels, and then likewise via an analyzer (P2). The light beam reflected at the beam splitter (1) is additionally directed via the 90° prism (10), resulting in parallel beam directions for the two channels. This enables a compact design. The properties, orientation and arrangement of the optical components are selected such that for s-polarization and p-polarization in the case of transmission and reflection at interfaces (beam splitter (1), 90° prism (10)) the different phase shifts do not substantially affect the phase difference between the two channels and the modulation contrast.

Temperature compensation:

The detected electrooptic signals or light intensities $I_1$ and $I_2$ are usually temperature-dependent. In the case of $Bi_4(GeO_4)_3$ (BGO), for example, the temperature coefficient of the decisive electrooptic coefficient is approximately $2.4 \cdot 10^{-4}$ $K^{-1}$, that is to say given a temperature increase by 100 K, the signal increases by 2.4% for a constant applied voltage. An additional temperature measurement is therefore required for an accurate voltage measurement. In order to avoid a separate temperature sensor, use is made of a λ/4-delay plate (9), the delay of which is dependent on temperature to a suitable extent. The temperature of the λ/4-delay plate (9) and its immediate environment can then be determined by measuring the phase difference (Δϕ) of the two electrooptic signals ($I_1$, $I_2$). The voltage or measurement result signal (S) can then be appropriately corrected.

For a λ/4-delay plate (9) of 0th order made from quartz, the delay varies for a wavelength of 633 mm by approximately 0.5° when the temperature changes by 50 K. A greater temperature dependence can be achieved by using a λ/4-delay plate (9) of higher order, since the temperature-induced phase change grows in proportion to the order number. For a λ/4-delay plate (9) having, for example, 2.25 orders, that is to say having a relative delay of 2.25 wavelengths, the delay varies by approximately 4.5° when the temperature changes by 50 K.

Figure 9:
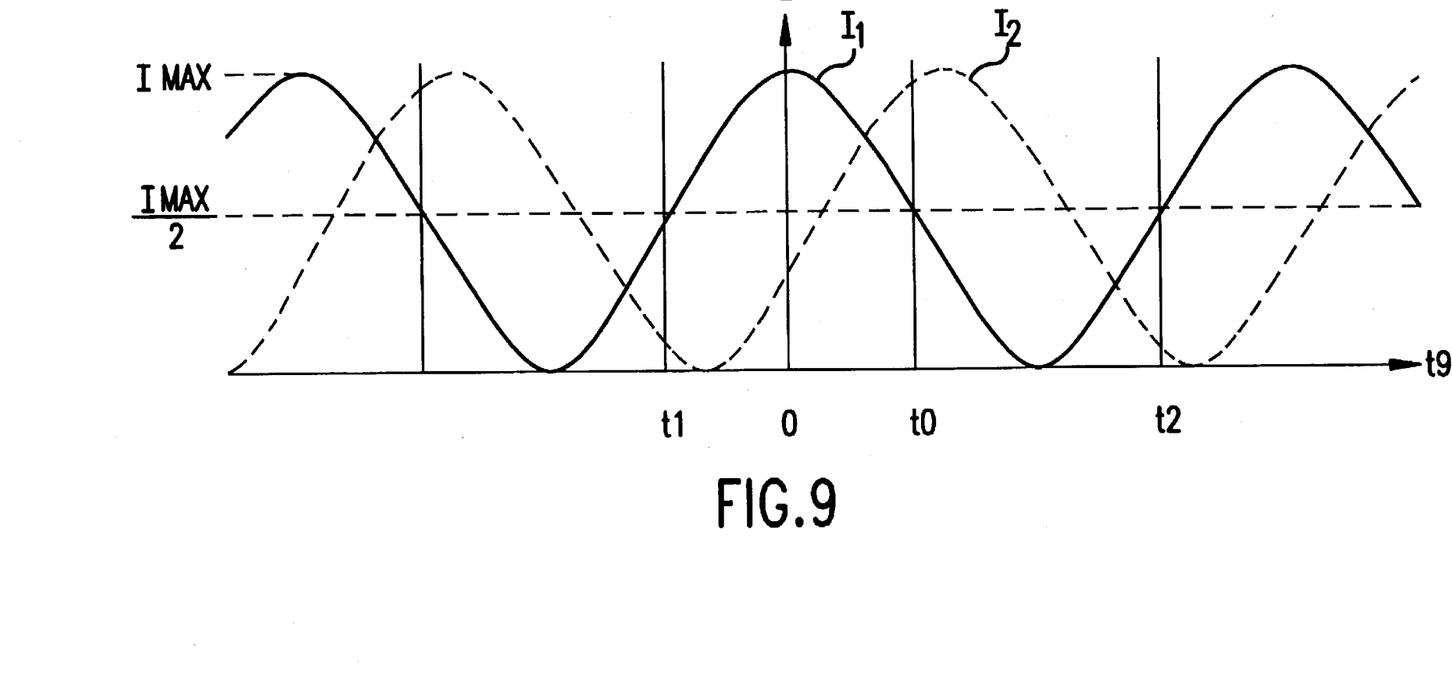
FIG. 9 shows a signal diagram of 2 electrooptic signals as a function of time, in order to explain the temperature compensation and FIGS. 10. and 11 show sensors for a dynamic optical pressure measurement or force measurement.

The determination of the phase difference (Δϕ) between the two electrooptic signals ($I_1$, $I_2$) is explained with the aid of FIG. 9, in which these electrooptic signals ($I_1$, $I_2$) are represented as a function of time (t). The phase difference (Δϕ) between the two electrooptic signals ($I_1$, $I_2$) corresponds to the delay introduced by the λ/4-delay plate (9). Said delay depends on temperature. The phase difference (Δϕ) can be determined directly from measurement of the instants t0, t1 and t2 of the passages of $I_2$ and $I_1$ through $I_{max}/2$ in accordance with:

$$\Delta\phi = 180° \cdot (t0-t1)/(t2-t1). \tag{15}$$

The deviation of the phase difference (Δϕ) from 90° is therefore: $\Delta\phi' = \Delta\phi - 90°$.

The λ/4-delay plate (9) is to be designed such that Δϕ is 90° at room temperature (293 K), and therefore $\Delta\phi'=0$. $\Delta\phi'$ is then dependent as follows on absolute temperature T:

$$\Delta\phi'(T) = \gamma \cdot (T-293), \tag{16}$$

γ being the temperature coefficient of the λ/4-delay plate (9).

$$\gamma = 0.09° \text{ } K^{-1} \text{ for a } \lambda/4 \tag{17}$$

having 2.25 orders.

The temperature T of the sensor head can then be determined in kelvins in accordance with:

$$T = \Delta\phi'(T)/\gamma + 293. \tag{18}$$

The temperature T which is now known can be used to correct the signal (S) obtained by the microprocessor (14) from the electrooptic signals ($I_1$, $I_2$) with respect to temperature T in accordance with:

$$S_{k} = s \cdot \delta(T), \tag{19}$$

it being the case that δ(T) is given as $$\delta(T) = 1 + \epsilon(T-293). \tag{20}$$

ε is the temperature coefficient of the electrooptic phase shift. ε is approximately $2.4 \cdot 10^4$ $K^{-1}$ for $Bi_4(GeO_4)_3$ (BGO).

The sensor is to be calibrated so as to produce the desired signal (S) for T=293 K with δ(293 K)=1. For the case in which the sensor is used for force measurement (see further below), use is to be made in equation (20) of the temperature coefficient of the mechanically induced birefringence.

In the case of crystals of classes 6m2 and 2 mm, which have an intrinsic birefringence, the temperature dependence of this birefringence can be used for temperature measurement. A change in the birefringence leads to an additional, slow phase shift in the two electrooptic signals ($I_1$, $I_2$). This phase shift is equally large for both electrooptic signals ($I_1$, $I_2$). In addition, there is the temperature-dependent change in their relative phase on the basis of the temperature dependence of the λ/4-delay plate (9), which is, however, negligibly small by comparison with the absolute shift.

The slow phase shift, which depends on temperature, can be determined in increments of 90° from the overall number of zero-crossings occurring for the two electrooptic signals ($I_1$, $I_2$). If the zero-crossings are counted with a positive sign in the case of a positive phase shift, and those relating to a negative phase shift are counted with a negative sign, the total number of the accumulated zero-crossings which are caused by the applied alternating voltage (8) is 0 after each full period of the alternating voltage (8). All the additionally occurring zero-crossings are to be ascribed to temperature changes or DC voltage components. The number of the zero-crossings owing to DC voltages is, however, negligibly small by comparison with temperature-induced zero-crossings.

The phase shift owing to the intrinsic birefringence is given in the case of a 2-fold passage of the light through the electrooptic crystal (4) as:

$$\Delta\Gamma = 4\cdot\pi\cdot L\cdot\Delta n/\lambda \quad (21)$$

where L=crystal length, λ=wavelength of the light, and Δn=difference between the refractive indices in the case of birefringence.

In the case of a temperature change ΔT, the phase changes by $$\delta\Gamma(\Delta T) = \Delta\Gamma|_{\gamma_{\Delta n}}\cdot\Delta T \quad (22)$$

$\gamma_{\Delta n} = \delta\Delta n/(\Delta n\cdot\delta T)$ is the temperature coefficient of the birefringence.

δΓ(ΔT) is yielded from the number N(ΔT) of the additional zero-crossings in increments of π/2 or 90° in accordance with:

$$\delta\Gamma(T) = N(\Delta T)\cdot\pi/2. \quad (23)$$

The temperature dependence is therefore:

$$\Delta T = [N(\Delta T)\cdot\pi]/2\cdot\Delta\Gamma\cdot\gamma_{\Delta n}). \quad (24)$$

Only temperature changes can be measured in the case of this method. The initial temperature $T_a$ must be input anew for each commissioning of the sensor. It then holds that:

$$T = T_a = \Delta T \quad (25)$$

Example

For birefringence with Δn=0.01. a temperature coefficient of birefringence of $\gamma_{\Delta n}=10^{-4}$ $K^{-1}$, a crystal length L=10 cm, a wavelength λ=780 nm and a 2-fold passage of light through the electrooptic crystal (4), the result is:

$$\text{a total phase shift } \Delta\Gamma=1.6\cdot 10^4 \text{ rad and,} \quad (26)$$

a phase shift, in the case of a temperature change by ΔT, of:

$$\delta\Gamma = 1.61\cdot\Delta T \quad (27)$$

The result for ΔT=1 K is δΓ=1.61 rad or 92°.

Figure 10:
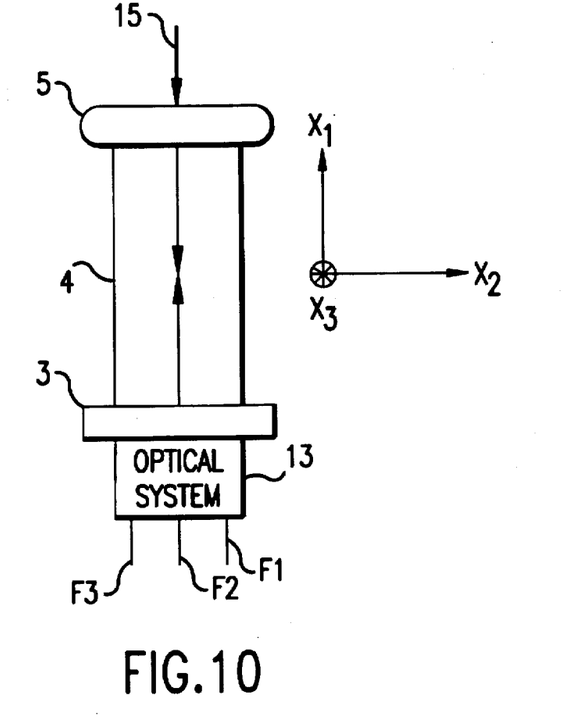

The sensor can basically also be used for a dynamic optical measurement of pressure or force. A possible configuration is represented in FIG. 10. A force (15) acts here parallel to a light propagation direction ($X_1$). Given a suitable choice of the crystal class and crystal orientation, the electrooptic crystal (4) is birefringent for light which propagates along the light propagation direction ($X_1$). In the case of a cubic crystal (4) of classes 23 (T) or m3 ($T_h$), one light propagation direction (X3) is to coincide with one of the 3 cube axes. The 3 principal refractive indices for the polarization directions parallel to the cube axes then change in accordance with:

$$\Delta n_1 = -n_0^3\cdot\pi_{11}\cdot\sigma/2,$$

$$\Delta n_2 = -n_0^3\cdot\pi_{13}\cdot\sigma/2,$$

$$\Delta n_3 = -n_0^3\cdot\pi_{12}\cdot\sigma/2,$$

$n_0$ signifying the refractive index without an applied force (15), σ signifying the applied force (15) per face, and $\pi_{ij}$ signifying the photoelastic coefficients. $\pi_{12}=\pi_{13}$, and thus $\Delta n_2=\Delta n_3$ for an electrooptic crystal (4) which belongs to one of the 3 other cubic classes 43m, 432, m3m ($T_d$, O, $O_n$). These classes are therefore not suitable for measuring pressure in the configuration in accordance with FIG. 10.

The birefringence is given by:

$$\Delta n = \Delta n_2 - \Delta n_3 = -n_0^3\cdot(\pi_{13}-\pi_{12})\cdot\sigma/2$$

for classes 23 and m3.

The polarization direction of the incident light preferably forms a 45° angle with the $X_2$- and $X_3$-axes. The resulting phase difference, which is accumulated by the two orthogonal polarization components parallel to $X_2$ and $X_3$ in the case of 2-fold passage of the electrooptic crystal (4) of length (L), is given by equation (26).

Example

The difference $\pi_{13}-\pi_{12}$ is usually of the order of $10^{-12}$ $m^2/N$. The result with $n_0=2$, L=0.1 m, σ=$10^6$ N/$m^2$ and λ=780 nm is ΔΓ=6.44 rad or 369°.

It would also be possible to use noncubic crystal classes for the measurement of force.

Figure 11:
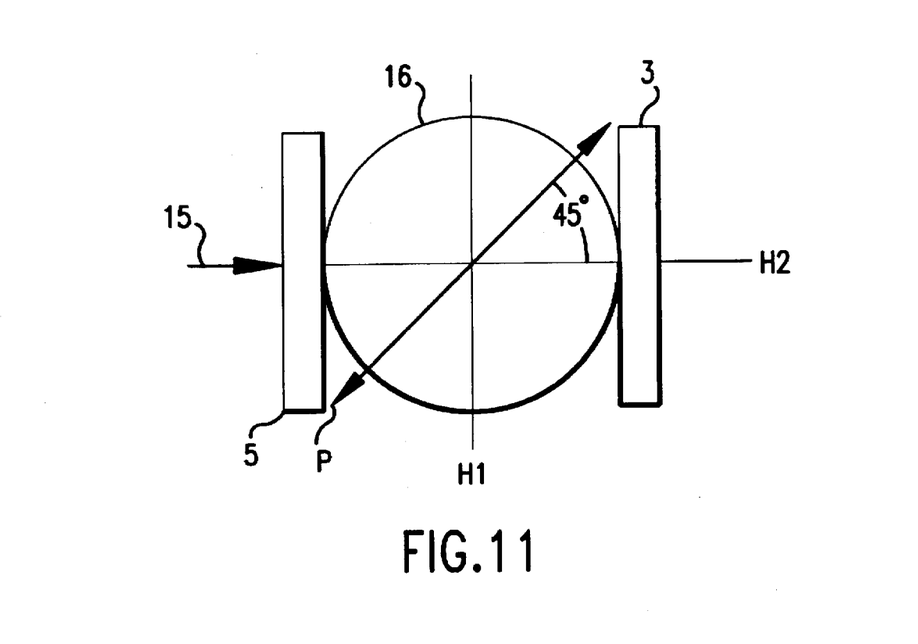

It would also be possible, in accordance with FIG. 11, to exert the force (15) transversely onto a glass rod (16), represented in cross section, instead of longitudinally onto an electrooptic crystal (4). The polarization (P) of the incident light would have to lie here preferably at 45° relative to the direction of the force (15). (H1) and (H2) designate principal axes of the induced birefringence.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for optically determining a physical quantity which effects a phase shift of light in a light beam upon passage of the light beam through an optical medium, comprising the steps of:

a) directing a linearly polarized input light beam in a first direction through an electrooptic crystal which has first, second and third electrooptically distinctive axes, said linearly polarized input light beam having a prescribable first polarization angle relative to said first electrooptically distinctive axis of said electrooptic crystal, wherein said first and second electrooptically distinctive axes are orthogonal to one another and lie in a plane which is orthogonal to said third electrooptically distinctive axis, and on which plane light is propagated along said first electrooptically distinctive axis faster than it is along said second electrooptically distinctive axis in response to an influence of at least one of an electric field and a force field;

b) deflecting said input light beam in a second direction through said electrooptic crystal;

c) directing said deflected light beam through a beam splitter and a first polarizer, to a first optoelectric detector which outputs a first phase signal; and d) directing said deflected light beam via a phase shifter with a prescribable first phase shift, and a second polarizer, to a second optoelectric detector which outputs a second phase signal which is phase-shifted relative to said first phase signal.

2. The method as claimed in claim 1, wherein the first polarization angle lies in a range of 30°–60°.

3. The method as claimed in claim 1, wherein: the first polarization angle lies in a range of 40°–50°.

4. The method as claimed in claim 1 further comprising a step of:

directing each of the input light beam sent into the electrooptic crystal in said first direction, and the deflected light beam directed back through the electrooptic crystal in said second direction, through the electrooptic crystal on different beam paths.

5. The method as claimed in claim 1, further comprising a step of:

deriving a measurement result signal S from the first and second phase signals, and correcting the measurement result signal relative to its temperature dependence in accordance with:

$$S_k = S \cdot \delta(T)$$

where: $\delta(T) = +1+\epsilon(T-293)$, $\epsilon$ is a temperature coefficient of an electrooptic phase shift, $T=\Delta\phi'/\gamma+293$=temperature of the phase shifter in kelvins, $\gamma$=a temperature coefficient of the phase shifter, $\Delta\phi'=180 \cdot (t0-t1)/(t2-t1)-90°$, t1 and t2=successive passages of the first phase signal through $I_{max}/2$, t0=passage of the second phase signal through $I_{max}/2$, t1<t0<t2, and $I_{max}$=maximum amplitude of.

6. The method as claimed in claim 1, further comprising a step of:

deriving a measurement result signal S from the first and second phase signals, and correcting the measurement result signal relative to its temperature dependence in accordance with:

$$S_k = S \cdot \delta(T)$$

where $\delta(T)=1+\epsilon(T-293)$, $\epsilon$ is a temperature coefficient of mechanically induced birefringence, $T=T_a+\Delta T$, Ta=initial temperature, $\Delta T=N\cdot\pi/2\cdot\Delta\Gamma\cdot\gamma\Delta n$), $\Delta\Gamma=4\cdot\pi\cdot L\cdot m/\lambda$, L=crystal length, $\lambda$=wavelength of the light, $\Delta n$=difference in refractive indices due to said birefringence, and N=number of additional zero-crossings in increments of $\pi/2$.

7. Apparatus for generating phase-shifted signals at an electrooptic sensor comprising:

a) a first polarizer;

b) an electrooptic crystal;

c) a light source optically connected via said first polarizer to a first light admission face of said electrooptic crystal, said first light admission face having mechanically induced birefringence;

d) at least one phase-delay plate;

e) at least one additional polarizer between a first light exit face of the electrooptic crystal and a first light detector for converting optical signals into electric signals;

f) a device for reversing light through the electrooptic crystal, the electrooptic crystal being connected on a second face, opposite the first light admission face, to said device, wherein said first light admission face is the first light exit face; and g) a beam splitter, wherein said first light exit face of the electrooptic crystal is optically connected via said beam splitter to the phase-delay plate and, via said first polarizer, to a second light detector for converting optical signals into electric signals.

8. Apparatus as claimed in claim 7, further comprising:

a 90° prism, wherein the beam splitter is optically connected via said 90° prism to at least one of the first and second light detectors.

9. Apparatus as claimed in claim 8, further comprising:

electrically conductive layer electrodes, said electrooptic crystal being connected to said electrically conductive layer electrodes via said first light admission face and said second face.

10. Apparatus as claimed in claim 9, wherein the electrically conductive layer electrodes are transparent to light at the first light admission face.

11. Apparatus as claimed in claim 7, wherein the device for reversing the light through the electrooptic crystal is at least one of a mirror and a 90° prism.

* * * * *